(12) United States Patent
Furukawa et al.

(10) Patent No.: US 6,207,069 B1
(45) Date of Patent: Mar. 27, 2001

(54) PIEZOELECTRIC CERAMICS AND PIEZOELECTRIC DEVICE

(75) Inventors: Masahito Furukawa; Kazutaka Suzuki; Yoshiko Gokita, all of Tokyo; Takumi Satou, Nagaoka; Keisuke Itakura, Tokyo, all of (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 09/255,036

(22) Filed: Feb. 22, 1999

(30) Foreign Application Priority Data

Feb. 27, 1998 (JP) .................................. 10-064462
Jun. 19, 1998 (JP) .................................. 10-189711

(51) Int. Cl.⁷ ...................... C04B 35/491; H01L 41/187
(52) U.S. Cl. .................................. 252/62.9 PZ; 501/134; 501/135
(58) Field of Search ................... 252/62.9 PZ; 501/134, 501/135

(56) References Cited

FOREIGN PATENT DOCUMENTS

| 1200825 | * | 8/1970 | (GB) | ............................. 252/62.9 PZ |
| 51-11199 | * | 1/1976 | (JP) | ............................. 252/62.2 PZ |
| 54-18400 |   | 7/1979 | (JP) | . |
| 62-154682 |  | 7/1987 | (JP) | . |
| 2-149427 | * | 6/1990 | (JP) | . |
| 3-256380 |  | 11/1991 | (JP) | . |
| 3-256382 |  | 11/1991 | (JP) | . |
| 6-112542 |  | 4/1994 | (JP) | . |

* cited by examiner

Primary Examiner—C. Melissa Koslow
(74) Attorney, Agent, or Firm—Oblon, Spivak, McClelland, Maier & Neustadt, P.C.

(57) ABSTRACT

Manganese oxide and tantalum oxide are added to a piezoelectric ceramic composition based on lead zinc-niobate titanate zirconate. The composition is suitable for piezoelectric transformers since its mechanical quality factor (Qm) is improved without reducing its electromechanical coupling coefficient ($k_{31}$), and good high-power properties and high mechanical strength are obtained. In another embodiment, manganese oxide and at least one of antimony oxide and niobium oxide are added to a piezoelectric ceramic composition based on lead zinc-niobate titanate zirconate.

18 Claims, 1 Drawing Sheet

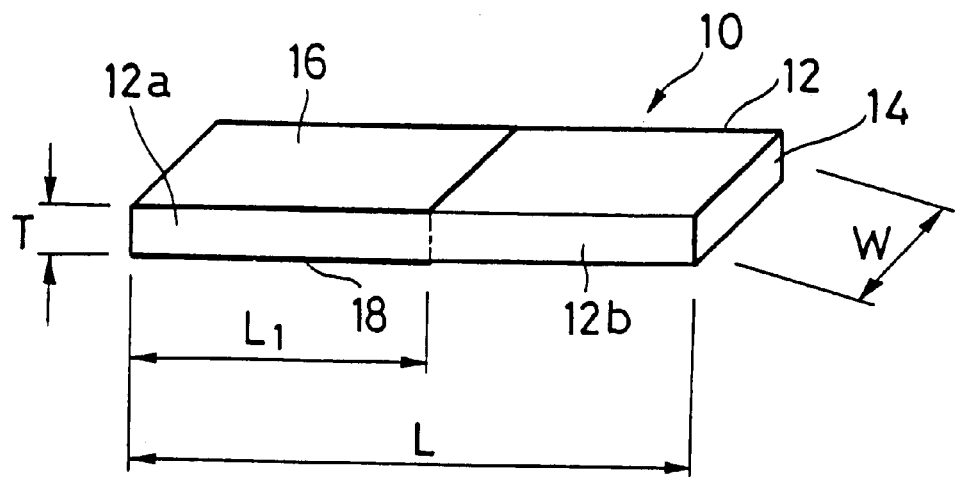
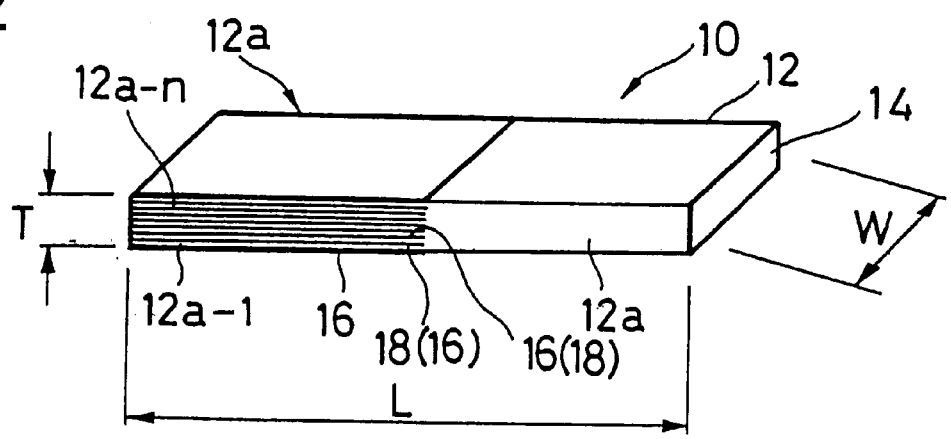
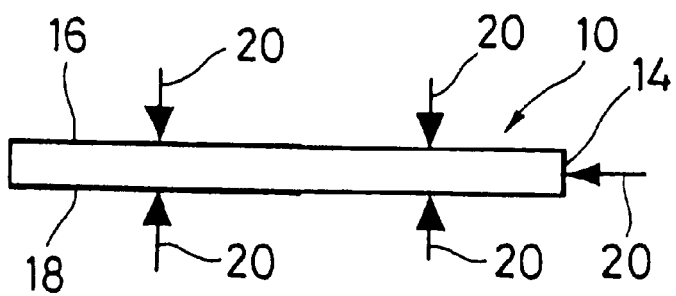

PIEZOELECTRIC CERAMICS AND PIEZOELECTRIC DEVICE

This invention relates to a piezoelectric ceramic composition based on lead zinc-niobate titanate zirconate and a piezoelectric device utilizing the same.

BACKGROUND OF THE INVENTION

In the prior art, ceramics containing lead titanate or lead zirconate titanate (PZT) as a main component are known as piezoelectric materials. Piezoelectric ceramic compositions further containing a second component, an optional third component and various additives are known to exhibit improved piezoelectric and electric properties.

Piezoelectric compositions having sufficient piezoelectric properties for use in ultrasonic vibrators, filters, and piezoelectric transformers are obtained by adding manganese oxide and cobalt oxide to lead zinc-niobate titanate zirconate as described in JP-B 18400/1979. Similar compositions wherein part of lead is replaced by strontium, barium or the like are disclosed in JP-A 154682/1987. These compositions are now used in a variety of applications.

While piezoelectric transformers have long been studied, they now draw more attention because of their advantages of compactness (especially thickness reduction), weight reduction, high efficiency, and low noise as compared with electromagnetic transformers.

In general, piezoelectric transformers are in the form of a rectangular piezoelectric ceramic plate structured such that one half is polarized in a thickness direction to constitute a primary or input section and the other half is longitudinally polarized to constitute a secondary or output section. When an ac electric field of one or one half wavelength resonance is applied across the piezoelectric transformer of this structure, the electrical energy is converted into vibration energy in the low impedance primary section. This vibration energy is conveyed to the high impedance secondary section where it is converted into electrical energy to develop a high voltage.

The piezoelectric ceramics for use in piezoelectric transformers are required to have a high electromechanical coupling coefficient ($k_{31}$) and a large mechanical quality factor (Qm). If they are small, the loss becomes greater and the conversion efficiency becomes lower. More particularly, the heat generated upon high-power driving increases, which invites a further reduced conversion efficiency and a reduced voltage step-up ratio. In the piezoelectric ceramics, defects such as voids are closely correlated to mechanical strength. If piezoelectric ceramics having a number of defects such as voids are used in piezoelectric transformers and other devices that are driven at a large amplitude, not only the ceramics are broken by impact, but breakage also occurs at the point where stresses concentrate, known as the nodal point, when the input voltage is increased to excite vibration at a large amplitude. Therefore, the piezoelectric ceramics for use in piezoelectric transformers are required to have a high mechanical strength. Also, the piezoelectric ceramics for use in ultrasonic motors are required to have a high electromechanical coupling coefficient ($k_{31}$) and a high mechanical quality factor (Qm) as well as a high mechanical strength.

Among the piezoelectric ceramics for piezoelectric transformers, for example, JP-B 18400/1979 discloses a composition comprising a lead zinc-niobate titanate zirconate composition represented by Pb $(Zn_{1/3}Nb_{2/3})_x Ti_y Zr_z O_3$ wherein $x+y+z=1$, $0.01 \leq x \leq 0.5$, $0<y \leq 0.75$, and $0<z \leq 0.75$, as a main component and further containing 0.01 to 5% by weight of manganese oxide ($MnO_2$) and 0.1 to 5% by weight of cobalt oxide (CoO). JP-A 112542/1994 discloses a lead zirconate titanate ceramic composition comprising PbO, $ZrO_2$ and $TiO_2$ and similar ceramic compositions wherein zirconium and titanium are replaced in part by antimony and niobium.

However, in the piezoelectric ceramic of the composition described in the above-referred JP-B 18400/1979, it is impossible to increase both the electromechanical coupling coefficient ($k_{31}$) and mechanical quality factor (Qm) and hence, to provide a fully high conversion efficiency. No improvement in mechanical strength is expected.

Intending to improve the mechanical strength of piezoelectric ceramics, the above-referred JP-A 112542/1994 proposes that the raw material powder is finely divided to a smaller particle size, specifically a specific surface area of at least 10 m²/g and calcined at a temperature below 650° C. so that the resulting element may have a grain size of up to 1 μm. However, the finely divided raw material powder is difficult to handle and the addition of a comminuting step increases the cost of manufacture. The piezoelectric ceramic of the composition described in JP-B 18400/1979 is low in both electromechanical coupling coefficient ($k_{31}$) and mechanical quality factor (Qm) and hence, conversion efficiency.

It is known to increase the mechanical strength of piezoelectric ceramics by utilizing a hot press. The use of a hot press prolongs the manufacturing process as compared with conventional firing and requires an expensive equipment, leading to an increased cost of manufacture.

SUMMARY OF THE INVENTION

Therefore, a first object of the present invention is to improve the piezoelectric properties of a piezoelectric ceramic composition for use in piezoelectric devices, especially piezoelectric transformers, and more particularly to improve the mechanical quality factor without reducing the electromechanical coupling coefficient and improve the mechanical strength at the same time; and to produce such a piezoelectric ceramic composition at a low cost without resorting to a complex process.

A second object of the present invention is to provide a piezoelectric ceramic composition having a higher mechanical strength than prior art piezoelectric ceramics at no sacrifice of piezoelectric properties, in a simple manner and at a low cost.

The present invention provides a piezoelectric ceramic composition comprising main and auxiliary components. In a first embodiment, the main component is represented by the formula:

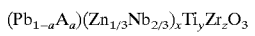

$$(Pb_{1-a}A_a)(Zn_{1/3}Nb_{2/3})_x Ti_y Zr_z O_3$$

wherein A is at least one metal element selected from the group consisting of calcium, strontium, and barium, letters a, x, y, and z representative of molar ratios are numbers satisfying the range: $0 \leq a \leq 0.1$, $x+y+z=1$, $0.05 \leq x \leq 0.4$, $0.1 \leq y \leq 0.5$, and $0.2 \leq z \leq 0.6$. The auxiliary component contains 0.05 to 3% by weight calculated as $MnO_2$ of manganese oxide and 0.05 to 1.5% by weight calculated as $Ta_2O_5$ of tantalum oxide, based on the weight of the main component. The auxiliary component may further contain at least one of antimony oxide and niobium oxide, and the total content of tantalum oxide, antimony oxide, and niobium oxide, calculated as $Ta_2O_5$, $Sb_2O_3$, and $Nb_2O_5$, respectively, is up to 5% by weight based on the weight of the main component.

In a second embodiment, the main component is the same as above and the auxiliary component contains manganese oxide and at least one of antimony oxide and niobium oxide. The content of manganese oxide calculated as $MnO_2$ is 0.05 to 3% by weight based on the weight of the main component. The total content of antimony oxide and niobium oxide, calculated as $Sb_2O_3$ and $Nb_2O_5$, respectively, is 0.05 to 5% by weight based on the weight of the main component.

A piezoelectric device comprising the piezoelectric ceramic composition of the first or second embodiment is also contemplated herein.

BRIEF DESCRIPTION OF THE DRAWINGS

The invention, together with its objects and advantages, is described in detail in conjunction with the accompanying drawings.

FIG. 1 is a perspective view of one exemplary piezoelectric transformer which is one embodiment of the piezoelectric device according to the invention.

FIG. 2 is a perspective view of another exemplary piezoelectric transformer which is one embodiment of the piezoelectric device according to the invention.

FIG. 3 is a side view of the piezoelectric transformer of FIG. 1.

DESCRIPTION OF THE PREFERRED EMBODIMENTS

First Embodiment

The piezoelectric ceramic composition according to the first embodiment of the invention contains a main component of a lead zinc-niobate titanate zirconate system and a predetermined amount of an auxiliary component containing at least manganese oxide and tantalum oxide. Due to the addition of the auxiliary component, the piezoelectric ceramic composition of the first embodiment exhibits a high mechanical quality factor (Qm) without a drop of electromechanical coupling coefficient ($k_{31}$), and improved high-power properties. Specifically, there result a high conversion efficiency, a high voltage step-up ratio, and less heat generation upon driving. Also, a high mechanical strength is obtained. These advantages are accomplished simply by adding the above-described auxiliary component. Since it is unnecessary to finely divide the raw material powder or to alter the manufacturing process, the problems including difficulty to handle the raw material powder and an increased cost are eliminated.

It is noted that JP-A 149427/1990, 256380/1991, and 256382/1991 disclose piezoelectric ceramic compositions comprising a main component of a lead zinc-niobate titanate zirconate system with $Ta_2O_5$ added thereto. However, it is described nowhere to add $Ta_2O_5$ and $MnO_2$ in admixture. These patents describe that piezoelectric ceramics are used as acoustic transducers such as piezoelectric buzzers and actuators, but do not refer to piezoelectric transformers. The required properties of piezoelectric ceramics to be used as acoustic transducers and actuators are different from the required properties of piezoelectric ceramics to be used as piezoelectric transformers. For example, when piezoelectric ceramics are used as acoustic transducers such as piezoelectric buzzers, a smaller mechanical quality factor (Qm) is preferred in order to prevent abrupt resonance as described in JP-A 256382/1991. The same applies to actuators. Accordingly, the design concept of a piezo-electric ceramic composition largely differs depending on whether it is intended to apply to acoustic transducers and actuators or piezoelectric transformers. In fact, mere addition of $Ta_2O5$ without $MnO_2$ fails to provide a high mechanical quality factor (Qm). It is noted that JP-A 256380/1991 describes that the mechanical quality factor (Qm) is improved by adding $Ta_2O_5$ and the mechanical strength is improved by adding $B_2O_3$. However, mere addition of $Ta_2O_5$ without $MnO_2$ fails to accomplish an equivalent effect to the first embodiment of the invention.

The piezoelectric ceramic composition of the first embodiment contains a main component represented by the formula:

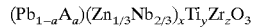

$(Pb_{1-a}A_a)(Zn_{1/3}Nb_{2/3})_xTi_yZr_zO_3$ and an auxiliary component containing at least manganese oxide and tantalum oxide.

In the formula representing the main component, A is at least one metal element selected from the group consisting of calcium (Ca), strontium (Sr), and barium (Ba). Letters a, x, y, and z are representative of molar ratios of the espective elements and are numbers satisfying the range:

$0 \leq a \leq 0.1$, $x+y+z=1$, $0.05 \leq x \leq 0.4$, $0.1 \leq y \leq 0.5$, and $0.2 \leq z \leq 0.6$.

If the composition of the main component is outside the range, piezoelectric ceramic compositions show insufficient properties, especially poor high-power properties. Element A is added if necessary for improving temperature-frequency and other properties. Ca, Sr and Ba may be contained as A in any desired proportion.

The content of the auxiliary component based on the weight of the main component is 0.05 to 3% by weight, preferably 0.1 to 1.5% by weight, calculated as MnO2 of manganese oxide and 0.05 to 1.5% by weight, preferably 0.3 to 1.2% by weight, calculated as $Ta_2O_5$ of tantalum oxide. Less contents of manganese oxide lead to poor electrical properties. Excessive contents of manganese oxide lead to a loss of mechanical strength. Less contents of tantalum oxide provide insufficient improvements in electrical properties and mechanical strength. Excessive contents of tantalum oxide lead to poor electrical properties.

In addition to manganese oxide and tantalum oxide, the piezoelectric ceramic composition of the first embodiment may further contain at least one of antimony oxide and niobium oxide as the auxiliary component. The containment of antimony oxide and niobium oxide achieves further improvements in electrical properties and mechanical strength. Antimony oxide and niobium oxide are preferably added in such amounts that their total content combined with tantalum oxide is up to 5% by weight, more preferably up to 3% by weight based on the weight of the main component. Antimony oxide and niobium oxide may be mixed in any desired ratio. If the total content of these auxiliary components is too high, ceramic compositions tend to lose piezoelectric properties and mechanical strength. The total content of these auxiliary components is determined by calculating antimony oxide as $Sb_2O_3$, niobium oxide as $Nb_2O_5$, and tantalum oxide as $Ta_2O_5$.

It is noted that the content of manganese oxide calculated as $MnO_2$, for example, in the foregoing description designates the amount of $MnO_2$ provided that all manganese in the raw material is converted to $MnO_2$. Also, the above formula assumes that $(Pb_{1-a}A_a):O$ is 1:3 although this ratio may have an arbitrary value in the range of from 0.9:3 to 1:3. It is understood that the contents of auxiliary components are always calculated on the basis of $(Pb_{1-a}A_a):O=1:3$.

The piezoelectric ceramic composition of the first embodiment has a primary phase of perovskite structure. The mean grain size in the piezoelectric ceramic composition of the first embodiment is not critical although it is often preferably from 0.5 to 10 µm.

It is now described how to prepare the piezoelectric ceramic composition of the first embodiment. First of all, starting raw materials are mixed. The starting raw materials used are often oxides of the above-described main and auxiliary component elements. The raw materials for alkaline earth element oxide and manganese oxide, for example, may also be compounds which convert into oxides when fired, typically carbonates and oxalates.

The mixture of the starting raw materials is calcined in an oxidizing atmosphere, typically air. In most cases, the calcining temperature is preferably about 800 to 900° C. and the calcining time is preferably about 1 to 4 hours. The calcined product is ground or disintegrated, optionally combined with a small amount of a binder, and compacted under a pressure of about 4 to 6 t/cm$^2$. Next, the compact is fired in an oxidizing atmosphere, typically air, obtaining a piezoelectric ceramic composition. In most cases, the firing temperature is preferably about 900 to 1,100° C. and the firing time is preferably about 1 to 4 hours.

Although the piezoelectric ceramic composition of the first embodiment is best suited for piezoelectric transformers, it is also suited for other piezoelectric devices such as ultrasonic motors.

FIG. 1 schematically illustrates a Rozen piezoelectric transformer as one exemplary piezoelectric transformer. The piezoelectric transformer designated at 10 in FIG. 1 has a rectangular plate-shaped transformer body 12 formed of the piezoelectric ceramic composition of the first embodiment. The dimensions of the transformer body 12 are not critical although the body usually has a length L of 15 to 40 mm, a width W of 3 to 7 mm, and a thickness T of 0.7 to 1.5 mm. Although piezoelectric devices other than the piezoelectric transformers are usually as thin as 2 mm or less, especially ultrasonic motors often have a reduced thickness of 0.05 to 1 mm, the piezoelectric ceramic composition of the first embodiment has so high mechanical strength that a sufficient strength is maintained at such a thickness.

The transformer body 12 has an output electrode 14 at one end face. Input electrodes 16 and 18 are formed on the upper and lower surfaces of a half section of the transformer body 12 disposed remote from the output electrode 14. The output electrode 14 and input electrodes 16, 18 are formed of a conductor such as silver to a thickness of about 1 to 20 µm. The section of the transformer body 12 having the input electrodes 16, 18 formed thereon, designated a primary section 12a, is previously polarized in a thickness direction while the remaining section, designated a secondary section 12b, is longitudinally polarized. The primary section 12a has a length $L_1$ of about 7 to 20 mm.

In this piezoelectric transformer 10, an ac electric field of one or one half wavelength resonance applied from the input electrodes 16, 18 to the primary section 12a is converted into vibration energy, which is converted into electric energy again, whereby a boosted voltage is taken out of the output electrode 14. When the transformer body 12 is constructed by a single plate of the piezoelectric ceramic composition as shown in FIG. 1, a voltage step-up ratio of 5/1 to 15/1 may be achieved. To increase the voltage step-up ratio, the primary section 12a of the transformer body 12 may be formed to a structure having alternately stacked ceramic layers and electrode layers. Such a laminate structure achieves a voltage step-up ratio corresponding to the number of stacked layers. One exemplary laminate structure is shown in FIG. 2. As seen from FIG. 2, electrode layers 16 and 18 are on opposite sides of each of ceramic layers 12a-1 to 12a–n in the primary section 12a. Even when such a laminate structure is employed, the external dimensions are equal to those of the single plate of piezoelectric ceramic shown in FIG. 1.

The piezoelectric devices according to the first embodiment may be fabricated by conventional processes. In the piezoelectric transformer of the laminate structure shown in FIG. 2, it is desirable to simultaneously fire the ceramic and the electrodes, especially those electrodes interleaved between ceramic layers. The firing temperature is preferably 1,000 to 1,150° C.

Second Embodiment

The piezoelectric ceramic composition according to the second embodiment of the invention is improved in mechanical strength. The main component is the same as in the first embodiment while the content of manganese oxide among the auxiliary components and the reason of limitation thereof are the same as in the first embodiment. The auxiliary component other than manganese oxide is at least one of antimony oxide and niobium oxide. The total content of antimony oxide and niobium oxide, calculated as $Sb_2O_3$ and $Nb_2O_5$, respectively, is 0.05 to 5% by weight, preferably 0.1 to 3% by weight, based on the weight of the main component.

In the above composition, if the total content of antimony oxide and niobium oxide is less than 0.05% by weight, no improvement in mechanical strength is observed. If the total content is more than 5% by weight, piezo-electric properties and mechanical strength become poor. In most cases, antimony oxide and niobium oxide are added in the form of $Sb_2O_3$ and $Nb_2O_5$, respectively. When both antimony oxide and niobium oxide are added, they may be combined at any desired ratio.

As in the first embodiment, the contents of the respective components in the piezoelectric ceramic composition is determined by converting the amounts of metals at the time of mixing of raw materials to stoichiometric compositions. It is understood that in the piezoelectric ceramic composition, the contents other than the ratio of Pb to A and the ratios of (Zn+Nb) to Ti and Zr may deviate more or less from the stoichiometry of the above formula as previously described for the first embodiment.

The piezoelectric ceramic composition of the second embodiment may be prepared by a process as described for the first embodiment.

The piezoelectric ceramic composition of the second embodiment has a primary phase of perovskite structure. The mean grain size in the piezoelectric ceramic composition of the second embodiment is not critical although it is often preferably from 0.5 to 10 µm.

Like the piezoelectric ceramic composition of the first embodiment, the piezoelectric ceramic composition of the second embodiment is suited for use in piezoelectric devices such as piezoelectric transformers and ultrasonic motors.

EXAMPLE

Examples of the invention are given below by way of illustration and not by way of limitation.

Example 1

Example of the First Embodiment

There were furnished as starting raw materials for the main component, lead oxide (PbO), titanium oxide ($TiO_2$), zirconium oxide ($ZrO_2$), zinc oxide (ZnO), niobium oxide ($Nb_2O_3$), calcium carbonate ($CaCO_3$), strontium carbonate ($SrCO_3$), and barium carbonate ($BaCO_3$). There were also furnished as starting raw materials for the auxiliary component, manganese carbonate ($MnCO_3$), tantalum oxide ($Ta_2O_5$), antimony oxide ($Sb_2O_3$), and niobium oxide ($Nb_2O_5$). These powders were blended so that the main component might have the formula expressed in molar ratio (calculated as oxides):

$$(Pb_{0.995}A_{0.005})(Zn_{1/3}Nb_{2/3})_{0.20}Ti_{0.40}Zr_{0.40}O_3$$

and the weight percents of the auxiliary components based on the main component (calculated as oxides) might be as shown in Table 1. Within A, the atomic ratio of Ca:Sr:Ba was 1:2:2.

Each blend was wet milled in a ball mill, calcined for 2 hours at 800 to 900° C. in air, and wet milled again in a ball mill. A small amount of a binder was added to the calcined powder, which was compacted under a pressure of about 5 t/cm² into a plate-shaped compact of 50 mm×50 mm×10 mm thick.

Each compact was fired for 2 hours at 1,000 to 1,100° C. in air, yielding a piezoelectric ceramic sample. The samples were measured for density, finding that all the samples had a density of at least 95% of the theory.

Each piezoelectric ceramic sample was worked to 12 mm×3 mm×1 mm thick. Silver electrodes were baked to opposite surfaces of the sample. In silicone oil at 120° C., an electric field of 2 kV/mm was applied across the sample for 30 minutes for effecting polarization in thickness direction, obtaining a sample to be measured for electrical properties.

Using an IRE standard circuit, these samples to be measured for electrical properties were measured for resonance frequency (fr), anti-resonance frequency (fa), and frequency resistance, from which an electromechanical coupling coefficient ($k_{31}$) and a mechanical quality factor (Qm) were determined. The measurement was performed after 24 hours from the polarization. The results are shown in Table 1.

Next, to examine the high-power drive properties, each piezoelectric ceramic sample was worked to 4.5 mm×32 mm×1 mm thick. Silver electrodes were formed on the sample to construct a standard secondary Rozen piezoelectric transformer. Primary and secondary sections of the sample were successively polarized in thickness and longitudinal directions, respectively, by applying an electric field of 2 kV/mm across each sample section for 30 minutes in silicone oil at 120° C., obtaining a piezoelectric transformer sample. This piezoelectric transformer sample was held by contact probes 20 at the nodal points which are positions where no vibration occurs or stress becomes maximum and at the position of the output electrode, as shown in FIG. 3. In this state, transformer characteristics were evaluated from input and output measurements. It is understood that FIG. 3 is an elevational view of the piezoelectric transformer of the construction shown in FIG. 1. Reported as evaluation results in Table 1 are the input power (Pin) fed until the temperature is increased 15° C. by the heat generated upon driving, the conversion efficiency after a temperature rise of 15° C., and the voltage step-up ratio. The property measurement was carried out after a temperature rise of 15° C. because the temperature rise during operation is generally regarded to be less than about 15° C.

The piezoelectric ceramic sample was also worked to 4 mm×2 mm×0.9 mm thick. This sample was subject to a three-point bending test for measuring flexural strength according to JIS R-1601. The results of flexural strength measurement are shown in Table 1.

TABLE 1

| Sample No. | $MnO_2$ (wt %) | $Ta_2O_5$ (wt %) | $Sb_2O_3$ (wt %) | $Nb_2O_5$ (wt %) | CoO (wt %) | $k_{31}$ (%) | $Q_m$ | Pin (W) | Conversion efficiency (%) | Voltage step-up ratio | Flexural strength (kgf/mm²) |
|---|---|---|---|---|---|---|---|---|---|---|---|
| 101 | 0.8 | 0.2 | — | — | — | 32.68 | 1853 | 1.95 | 81.5 | 8.0 | 8.36 |
| 102 | 0.8 | 0.4 | — | — | — | 32.89 | 2010 | 2.35 | 84.0 | 8.2 | 12.74 |
| 103 | 0.8 | 0.5 | — | — | — | 33.35 | 2273 | 2.44 | 86.0 | 8.3 | 13.15 |
| 104 | 0.8 | 0.6 | — | — | — | 32.85 | 2285 | 2.45 | 85.0 | 8.7 | 12.73 |
| 105 | 0.8 | 0.8 | — | — | — | 30.68 | 2328 | 2.53 | 86.5 | 8.5 | 14.98 |
| 106 | 0.8 | 1.0 | — | — | — | 30.83 | 2315 | 2.50 | 86.0 | 8.4 | 13.77 |
| 107 | 1.0 | 0.2 | — | — | — | 33.02 | 1807 | 1.87 | 82.5 | 8.0 | 7.54 |
| 108 | 1.0 | 0.4 | — | — | — | 33.23 | 2155 | 2.10 | 84.0 | 8.0 | 11.82 |
| 109 | 1.0 | 0.6 | — | — | — | 33.19 | 2193 | 2.40 | 84.6 | 8.4 | 12.03 |
| 110* | — | — | — | — | — | 30.30 | 83 | 0.28 | 42.5 | 3.5 | 7.50 |
| 111* | 0.4 | — | — | — | — | 30.70 | 755 | 0.20 | 40.0 | 3.0 | 7.42 |
| 112* | 0.8 | — | — | — | — | 31.60 | 1687 | 1.80 | 81.0 | 8.0 | 11.27 |
| 113* | 1.0 | — | — | — | — | 32.91 | 1664 | 1.75 | 82.0 | 8.0 | 11.83 |
| 114* | 0.8 | — | — | — | 0.2 | 33.67 | 1464 | 1.40 | 81.0 | 8.0 | 7.57 |
| 115* | 0.8 | — | — | — | 0.4 | 35.07 | 1213 | 1.12 | 78.0 | 8.0 | 7.78 |
| 116* | 0.8 | — | — | — | 0.5 | 36.19 | 1323 | 1.11 | 78.0 | 8.2 | 6.57 |
| 117* | 0.8 | — | — | — | 0.7 | 34.66 | 832 | 1.11 | 78.0 | 8.2 | 6.04 |
| 118 | 0.8 | 0.4 | 0.5 | — | — | 32.92 | 2248 | 2.41 | 84.5 | 8.2 | 12.88 |
| 119 | 0.8 | 0.4 | 0.5 | 0.5 | — | 31.74 | 2391 | 2.30 | 84.2 | 7.8 | 12.60 |

*Comparison

As seen from Table 1, the samples containing manganese oxide and tantalum oxide and the samples further containing antimony oxide and/or niobium oxide are improved in both electromechanical coupling coefficient ($k_{31}$) and mechanical quality factor (Qm) and at the same time, increased in mechanical strength.

In contrast, the comparative samples containing manganese oxide and cobalt oxide are inferior in Qm, Pin, efficiency and flexural strength to the samples of the first embodiment.

Example 2

Example of the Second Embodiment

There were furnished as starting raw materials, lead oxide (PbO), titanium oxide ($TiO_2$), zirconium oxide ($ZrO_2$), zinc oxide (ZnO), niobium oxide ($Nb_2O_5$), antimony oxide ($Sb_2O_3$), manganese carbonate ($MnCO_3$), calcium carbonate ($CaCO_3$), strontium carbonate ($SrCO_3$), and barium carbonate ($BaCO_3$). These powders were blended so as to give the following compositional formula.

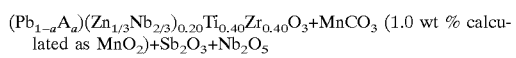

$(Pb_{1-a}A_a)(Zn_{1/3}Nb_{2/3})_{0.20}Ti_{0.40}Zr_{0.40}O_3+MnCO_3$ (1.0 wt % calculated as $MnO_2$)+$Sb_2O_3$+$Nb_2O_5$ The element A and its content and the weight percents of antimony oxide and niobium oxide are as shown in Table 2.

Each blend was wet milled in a ball mill, calcined for 2 hours at 800 to 900° C., and wet milled again in a ball mill. A small amount of a binder was added to the calcined powder, which was compacted under a pressure of about 5 t/cm² into a plate-shaped compact of 50 mm×50 mm.

Each compact was fired for 2 hours at 1,000 to 1,100° C. in air, yielding a piezoelectric ceramic sample. The samples were measured for density, finding that all the samples had a density of at least 95% of the theory.

The piezoelectric ceramic sample was worked to 4 mm×2 mm×0.9 mm thick. This sample was subject to a three-point bending test for measuring flexural strength according to JIS R-1601. The results of flexural strength measurement are shown in Table 2.

Next, to examine the breakage and transformer characteristics (e.g., efficiency and voltage step-up ratio) of a piezoelectric transformer, each piezoelectric ceramic sample was worked to a length L of 32 mm, a width W of 4.5 mm, and a thickness T of 1 mm. Silver electrodes were formed on the sample to construct a Rozen piezoelectric transformer as shown in FIG. 1. Primary and secondary sections of the sample were successively polarized in thickness and longitudinal directions, respectively, by applying an electric field of 2 kV/mm across each sample section for 30 minutes in silicone oil at 120° C., obtaining a piezoelectric transformer sample. The primary section had a length $L_1$ of 16 mm. This piezoelectric transformer sample was held by contact probes 20 at the nodal points and the position of the output electrode, as shown in FIG. 3. In this state, transformer characteristics were evaluated from input and output measurements. A destructive test was then carried out. With no load on the output side, a voltage of 200 V was applied to the input side so as to match with the resonance frequency (100 kHz). It was examined whether or not the sample failed after 1 minute. The sample was rated "O" when it did not fail and "X" when it failed. The results are also shown in Table 2.

TABLE 2

| Sample No. | A | a | $Sb_2O_3$ (wt %) | $Nb_2O_5$ (wt %) | Flexural strength (kgf/mm²) | Conversion efficiency (%) | Destructive test |
|---|---|---|---|---|---|---|---|
| 201* | — | — | 0 | 0 | 8.48 | 90.5 | X |
| 202* | — | — | 0.01 | 0 | 8.55 | 91.8 | X |
| 203 | — | — | 0.05 | 0 | 9.83 | 91.1 | O |
| 204 | — | — | 0.1 | 0 | 10.32 | 90.4 | O |
| 205 | — | — | 0.5 | 0 | 11.27 | 91.2 | O |
| 206 | — | — | 1 | 0 | 11.83 | 92.0 | O |
| 207 | — | — | 5 | 0 | 10.94 | 90.2 | O |
| 208* | — | — | 10 | 0 | 8.22 | 86.6 | X |
| 209* | — | — | 0 | 0.01 | 8.81 | 92.9 | X |
| 210 | — | — | 0 | 0.05 | 10.92 | 90.4 | O |
| 211 | — | — | 0 | 0.1 | 10.27 | 91.5 | O |
| 212 | — | — | 0 | 0.5 | 11.09 | 91.5 | O |
| 213 | — | — | 0 | 1 | 10.72 | 91.0 | O |
| 214 | — | — | 0 | 5 | 11.25 | 90.7 | O |
| 215* | — | — | 0 | 10 | 9.03 | 85.2 | X |
| 216* | — | — | 0.005 | 0.005 | 8.67 | 91.5 | X |
| 217 | — | — | 0.025 | 0.025 | 10.36 | 90.9 | O |
| 218 | — | — | 0.05 | 0.05 | 11.19 | 92.2 | O |
| 219 | — | — | 0.25 | 0.25 | 11.73 | 91.6 | O |
| 220 | — | — | 0.5 | 0.5 | 11.20 | 91.3 | O |
| 221 | — | — | 2.5 | 2.5 | 10.54 | 90.1 | O |
| 222* | — | — | 5 | 5 | 8.61 | 86.1 | X |
| 223* | Ca | 0.005 | 0.01 | 0 | 8.64 | 93.2 | X |
| 224 | Ca | 0.005 | 0.1 | 0 | 9.99 | 92.7 | O |
| 225 | Ca | 0.005 | 1 | 0 | 11.22 | 90.3 | O |
| 226* | Ca | 0.005 | 10 | 0 | 7.95 | 85.0 | X |
| 227* | Ca | 0.005 | 0 | 0.01 | 8.33 | 93.2 | X |
| 228 | Ca | 0.005 | 0 | 0.1 | 10.71 | 94.1 | O |
| 229 | Ca | 0.005 | 0 | 1 | 11.39 | 92.4 | O |
| 230* | Ca | 0.005 | 0 | 10 | 8.56 | 83.8 | X |
| 231* | Sr | 0.005 | 0.01 | 0 | 8.73 | 92.0 | X |
| 232 | Sr | 0.005 | 0.1 | 0 | 10.66 | 91.5 | O |
| 233 | Sr | 0.005 | 1 | 0 | 11.05 | 89.7 | O |
| 234* | Sr | 0.005 | 10 | 0 | 8.12 | 85.9 | X |
| 235* | Sr | 0.005 | 0 | 0.01 | 8.26 | 92.4 | X |
| 236 | Sr | 0.005 | 0 | 0.1 | 11.03 | 93.2 | O |
| 237 | Sr | 0.005 | 0 | 1 | 11.18 | 90.1 | O |
| 238* | Sr | 0.005 | 0 | 10 | 9.45 | 86.0 | X |
| 239* | Ba | 0.005 | 0.01 | 0 | 8.68 | 92.5 | X |
| 240 | Ba | 0.005 | 0.1 | 0 | 9.99 | 91.3 | O |
| 241 | Ba | 0.005 | 1 | 0 | 10.78 | 91.2 | O |
| 242* | Ba | 0.005 | 10 | 0 | 8.04 | 86.6 | X |
| 243* | Ba | 0.005 | 0 | 0.01 | 8.45 | 92.6 | X |
| 244 | Ba | 0.005 | 0 | 0.1 | 10.24 | 91.4 | O |
| 245 | Ba | 0.005 | 0 | 1 | 11.11 | 89.9 | O |
| 246* | Ba | 0.005 | 0 | 10 | 8.48 | 86.1 | X |

*Comparison

Of the samples shown in Table 2, those samples in which the total content of antimony oxide and niobium oxide was less than 0.05% by weight showed no improvement in mechanical strength and failed in the destructive test. Those samples in which the total content of antimony oxide and niobium oxide was more than 5% by weight showed little improvement in mechanical strength, failed in the destructive test, and had a low input-output conversion efficiency. In all the samples, failure occurred at the nodal point in the secondary section 12b of the transformer body 12.

As seen from Table 2, the addition of antimony oxide and niobium oxide is also effective for improving mechanical strength when part of lead was replaced by calcium, strontium or barium. The effective amount of antimony oxide and niobium oxide added is the same as when A consists solely of lead. When x, y and z were outside the desired range, firing was difficult and piezoelectric properties were very poor.

In the first embodiment in which specific amounts of manganese oxide and tantalum oxide are added to a piezoelectric ceramic composition based on lead zinc-niobate titanate zirconate, the mechanical quality factor (Qm) is improved without reducing the electromechanical coupling coefficient ($k_3l$). High-power properties are good. A high mechanical strength is obtained. These advantages are achieved without adding to the cost of manufacture.

In the second embodiment in which specific amounts of manganese oxide and at least one of antimony oxide and niobium oxide are added to a piezoelectric ceramic composition based on lead zinc-niobate titanate zirconate, mechanical strength is improved while maintaining transformer characteristics.

Japanese Patent Application Nos. 64462/1998 and 189711/1998 are incorporated herein by reference.

What is claimed is:

1. A piezoelectric ceramic composition, comprising:
a main component represented by the formula:

$$(Pb_{1-a}A_a)(Zn_{1/3}Nb_{2/3})_xTi_yZr_zO_3$$

wherein A is at least one metal element selected from the group consisting of calcium, strontium, and barium; and
wherein letters a, x, y, and z representative of molar ratios are numbers; and
wherein $0 \leq a \leq 0.1$, $x+y+z=1$, $0.05 \leq x \leq 0.4$, $0.1 \leq y \leq 0.5$, and $0.2 \leq z \leq 0.6$; and
an auxiliary component containing manganese oxide and either antimony oxide or antimony oxide and niobium oxide, the content of manganese oxide calculated as $MnO_2$ being 0.05 to 3% by weight based on the weight of the main component and the total content of antimony oxide and niobium oxide, calculated as $Sb_2O_3$ and $Nb_2O_5$, respectively, being 0.05 to 5% by weight based on the weight of the main component.

2. A piezoelectric device comprising the piezoelectric ceramic composition of claim 1.

3. A piezoelectric ceramic composition, comprising:
a main component represented by the formula:

$$(Pb_{1-a}A_a)(Zn_{1/3}Nb_{2/3})_xTi_yZr_zO_3$$

wherein A is at least one metal element selected from the group consisting of calcium, strontium, and barium; and
wherein letters a, x, y, and z representative of molar ratios are numbers; and
wherein $0 \leq a \leq 0.1$, $x+y+z=1$, $0.05 \leq x \leq 0.4$, $0.1 \leq y \leq 0.5$, and $0.2 \leq z \leq 0.6$; and
an auxiliary component containing manganese oxide and either antimony oxide or antimony oxide and niobium oxide, the content of manganese oxide calculated as $MnO_2$ being 0.05 to 3% by weight based on the weight of the main component and the total content of antimony oxide and niobium oxide, calculated as $Sb_2O_3$ and $Nb_2O_5$, respectively, being 0.05 to 5% by weight based on the weight of the main component;
wherein said piezoelectric ceramic composition has a mechanical quality factor, $Q_M$, suitable for piezoelectric transformers and ultrasonic motors.

4. A piezoelectric ceramic composition, comprising:
a main component represented by the formula:

$$(Pb_{1-a}A_a)(Zn_{1/3}Nb_{2/3})_xTi_yZr_zO_3;$$

wherein A is at least one metal element selected from the group consisting of calcium, strontium, and barium;
wherein letters a, x, y, and z representative of molar ratios are numbers; and
wherein $0 \leq a \leq 0.1$, $x+y+z=1$, $0.05 \leq x \leq 0.4$, $0.1 \leq y \leq 0.5$, and $0.2 \leq z \leq 0.6$; and
an auxiliary component containing 0.05 to 3% by weight calculated as $MnO_2$ of manganese oxide and 0.05 to 1.5% by weight calculated as $Ta_2O_5$ of tantalum oxide, based on the weight of the main component;
wherein said piezoelectric ceramic composition has a mechanical quality factor, $Q_M$, suitable for piezoelectric transformers and ultrasonic motors.

5. The piezoelectric ceramic composition of claim 4, wherein said auxiliary component further contains at least one of antimony oxide and niobium oxide; and
wherein the total amount of tantalum oxide, antimony oxide, and niobium oxide, calculated as $Ta_2O_5$, $Sb_2O_3$, and $Nb_2O_5$, respectively, is up to 5% by weight based on the weight of the main component.

6. A piezoelectric device, comprising:
the piezoelectric ceramic composition of claim 4.

7. The piezoelectric ceramic composition according to claim 4, wherein the mechanical quality factor, $Q_M$, is at least 1807.

8. The piezoelectric ceramic composition according to claim 4, wherein the composition has an electromechanical coupling coefficient ($k_{31}$) of at least 30.68%.

9. The piezoelectric ceramic composition according to claim 4, wherein the composition has a flexural strength of at least 8.36 kgf/$\mu$cm$^2$.

10. The piezoelectric ceramic composition according to claim 4, wherein the composition has a conversion efficiency of at least 81.5%.

11. The piezoelectric ceramic composition according to claim 4, wherein the composition has a voltage step-up ratio of at least 8.0.

12. The piezoelectric device according to claim 5, wherein said device is a piezoelectric transformer.

13. The piezoelectric device according to claim 5, wherein said device is an ultrasonic motor.

14. The piezoelectric device according to claim 12, wherein said piezoelectric transformer is a Rosen piezoelectric transformer.

15. The piezoelectric device according to claim 5, further comprising an output electrode and at least one input electrode.

16. The piezoelectric ceramic composition according to claim 4, wherein said piezoelectric ceramic composition is obtained by a process comprising:
mixing the oxides of Pb, Zn, Nb, Tr, Zr, Ta and Mn, and at least one carbonate of the elements Ca, Sr or Ba, thereby providing a mixture of oxides;
calcining of said mixture in an oxidizing atmosphere, thereby providing a calcined composition;
disintegrating said calcined composition, thereby providing a disintegrated composition;
optionally combining said disintegrated composition with a binder;
compacting said disintegrated composition at a pressure of about 4–6 t/cm$^2$, thereby providing a compacted composition; and
firing said compacted composition in an oxidizing atmosphere.

17. The piezoelectric ceramic composition according to claim 16, wherein said calcining occurs at a temperature of 800–900° C.

18. The piezoelectric ceramic composition according to claim 16, wherein said firing occurs at a temperature of 900–1100° C.

* * * * *

UNITED STATES PATENT AND TRADEMARK OFFICE
CERTIFICATE OF CORRECTION

PATENT NO.    : 6,207,069 B1                                       Page 1 of 1
DATED         : March 27, 2001
INVENTOR(S)   : Masahito Furukawa et al.

It is certified that error appears in the above-identified patent and that said Letters Patent is hereby corrected as shown below:

<u>Column 12,</u>
Line 28, "Claim 5" should read -- Claim 6 --;
Line 30, "Claim 5" should read -- Claim 6 --;
Line 35, "Claim 5" should read -- Claim 6 --.

Signed and Sealed this

Second Day of July, 2002

*Attest:*

*Attesting Officer*

JAMES E. ROGAN
*Director of the United States Patent and Trademark Office*